US009823710B2

(12) United States Patent
Ma et al.

(10) Patent No.: US 9,823,710 B2
(45) Date of Patent: Nov. 21, 2017

(54) MINIATURIZED COMPUTATION AND STORAGE MERGED SYSTEM

(71) Applicant: ZTE Corporation, Shenzhen (CN)

(72) Inventors: Qianli Ma, Shenzhen (CN); Chaoying Wang, Shenzhen (CN); Leifeng Yuan, Shenzen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 14/899,184

(22) PCT Filed: May 4, 2014

(86) PCT No.: PCT/CN2014/076733
§ 371 (c)(1),
(2) Date: Dec. 17, 2015

(87) PCT Pub. No.: WO2014/201917
PCT Pub. Date: Dec. 24, 2014

(65) Prior Publication Data
US 2016/0132079 A1 May 12, 2016

(30) Foreign Application Priority Data
Jun. 17, 2013 (CN) .......................... 2013 1 0239165

(51) Int. Cl.
G06F 1/18 (2006.01)
H05K 7/14 (2006.01)
G06F 1/20 (2006.01)

(52) U.S. Cl.
CPC .............. *G06F 1/184* (2013.01); *G06F 1/189* (2013.01); *G06F 1/20* (2013.01); *H05K 7/1445* (2013.01)

(58) Field of Classification Search
CPC .......... G06F 1/184; G06F 1/185; G06F 1/186; G06F 1/187; G06F 1/188; G06F 1/189;
(Continued)

(56) References Cited

U.S. PATENT DOCUMENTS

| 6,661,671 B1 * | 12/2003 | Franke | ................... G06F 1/189 361/679.02 |
| 7,722,359 B1 * | 5/2010 | Frangioso, Jr. | ...... H05K 7/1445 361/679.48 |

(Continued)

FOREIGN PATENT DOCUMENTS

| CN | 101425907 A | 5/2009 |
| CN | 102223296 A | 10/2011 |

(Continued)

OTHER PUBLICATIONS

International Search Report for corresponding application PCT/CN2014/076733 filed May 4, 2014; dated Aug. 8, 2014.

*Primary Examiner* — Hoa C Nguyen
*Assistant Examiner* — Christopher L Augustin
(74) *Attorney, Agent, or Firm* — Cantor Colburn LLP

(57) ABSTRACT

Provided is a miniaturized computation and storage merged system, which relates to the fields of communications, information, industrial control and the like. The miniaturized computation and storage merged system includes: a mid-back board having a plurality of board card slots; a first processing board which is connected with the mid-back board; a second processing board which is connected with the mid-back board; and one or more rear-inserted board cards, each of which is fixed on the mid-back board via a board card slot, wherein the one or more rear-inserted board cards are configured to provide support in data storage and/or computation for the first processing board and the second processing board, to enable the first processing board and the second processing board to complete a data storage (Continued)

and/or computation task. The system has a very high expansibility and a very high popularity.

10 Claims, 3 Drawing Sheets

(58) Field of Classification Search
CPC .. H05K 7/1445; H05K 7/1439; H05K 7/1444; H05K 7/1475; H05K 7/1477
See application file for complete search history.

(56) References Cited

U.S. PATENT DOCUMENTS

| | | | |
|---|---|---|---|
| 2008/0043405 A1* | 2/2008 | Lee | G06F 1/185 |
| | | | 361/600 |
| 2008/0052437 A1* | 2/2008 | Loffink | G06F 1/189 |
| | | | 710/302 |
| 2008/0140932 A1* | 6/2008 | Flynn | G06F 1/183 |
| | | | 711/114 |
| 2008/0253077 A1* | 10/2008 | Miyamoto | G06F 1/187 |
| | | | 361/679.31 |
| 2010/0254096 A1* | 10/2010 | Kim | G06F 1/185 |
| | | | 361/737 |
| 2013/0107454 A1* | 5/2013 | Wilke | H05K 7/20727 |
| | | | 361/694 |

FOREIGN PATENT DOCUMENTS

| | | |
|---|---|---|
| CN | 102710423 A | 10/2012 |
| CN | 202758296 U | 2/2013 |
| JP | 2008140094 A | 6/2008 |

\* cited by examiner

MINIATURIZED COMPUTATION AND STORAGE MERGED SYSTEM

TECHNICAL FIELD

The present disclosure relates to the fields of communications, information, industrial control and the like, and in particular to a miniaturized computation and storage merged system.

BACKGROUND

Storage Bridge Bay (SBB) is a standard proposed by a non-benefit cooperation organization to improve the standardization level of network storage interfaces. Version SBB 2.1 defines mechanical, electrical and under-layer management features of controllers and slots in a case-type storage array apparatus, enabling different storage manufacturers to have a uniform compatibility and interoperability for controllers manufactured based on this standard.

SBB 2.1 apparatus is designed for moderate and small-scale common network storage, broadly applicable to enterprise, government, finance, telecommunication, internet and other industries.

In the above industries, compared with storage applications, miniaturized computing applications are used more widely, for example, blade server, miniaturized Advanced Telecom Computing Architecture (ATCA) or Micro Telecom Computing Architecture (Micro TCA). However, the system in these applications has some drawbacks, for example, single function and low integration level. In addition, for computing applications, interfaces or processing resources provided are not sufficient due to some limitations and expansibility is low, or, cross-industry applications have a poor inter-convertibility or commonality.

SUMMARY

In view of the drawbacks in the above miniaturized computing and storage application, it is necessary to put forward a flexible system solution. Based on SBB 2.1 for example, referring to PCI Industrial Computer Manufacturers Group (PCIMG) 3.4 standards of ATCA, the embodiments of the present disclosure provide a miniaturized computation and storage merged system in conjunction with computation requirements to extend the SBB 2.1. This miniaturized computation and storage merged system can act as a computing application, or act as a storage application, or act as a computation and storage merged application.

To solve the above problem, an embodiment of the present disclosure provides a miniaturized computation and storage merged system, including:

a mid-back board having a plurality of board card slots;

a first processing board which is connected with the mid-back board;

a second processing board which is connected with the mid-back board; and one or more rear-inserted board cards, each of which is fixed on the mid-back board via a board card slot, wherein the one or more rear-inserted board cards are configured to provide support in data storage and/or computation for the first processing board and the second processing board, to enable the first processing board and the second processing board to complete a data storage and/or computation task.

Multiple common board card slots are provided on the mid-back board.

Both the first processing board and the second processing board are connected with the multiple common board card slots through Serial Attached SCSI (SAS) buses; the one or more rear-inserted board cards include one or more SAS hard disk board cards, each of which is fixed on the mid-back board via a common board card slot and is respectively connected with the first processing board and the second processing board through the SAS buses.

Both the first processing board and the second processing board are connected with the multiple common board card slots through Peripheral Component Interface Express (PCIe) buses; each of the one or more rear-inserted board cards is fixed on the mid-back board via a common board card slot, and is respectively connected with the first processing board and the second processing board through the PCIe buses.

The first processing board is connected with the second processing board through a heartbeat line, the first processing board is able to take over, when detecting through the heartbeat line that the second processing board has a fault, each rear-inserted board card which is fixed on a common board card slot and originally controlled by the second processing board, or the second processing board is able to take over, when detecting through the heartbeat line that the first processing board has a fault, each rear-inserted board card which is fixed on a common board card slot and originally controlled by the first processing board.

The one or more rear-inserted board cards further include one or more interface board cards, each of which is fixed on the mid-back board via a common board card slot and acts as an external multi-functional interface for the first processing board and the second processing board, the multi-functional interface including: Time Division Multiplexing (TDM) interface, Internet Protocol (IP) interface, data collection and conversion interface.

The one or more rear-inserted board cards further include one or more function board cards, each of which is fixed on the mid-back board via a common board card slot and is configured to provide a co-processing function for the first processing board and the second processing board, the co-processing function including: Deep Packet Inspection (DPI), Digital Signal Processing (DSP) and Internet Protocol Security (IPSec).

A first independent board card slot and a second independent board card slot are provided on the mid-back board; the first processing board is connected with the first independent board card slot and the second processing board is connected with the second independent board card slot; the one or more rear-inserted board cards further include: a first independent board card fixed on the mid-back board via the first independent board card slot and configured to provide an external interface or concatenation for the first processing board; a second independent board card fixed on the mid-back board via the second independent board card slot and configured to provide an external interface or concatenation for the second processing board.

Two power supply board card slots are provided on the mid-back board; the one or more rear-inserted board cards further include: two power supply input board cards fixed on the mid-back board via the two power supply board card slots;

the miniaturized computation and storage merged system further includes: two power supply fan boards, which are connected with the two power supply board card slots respectively, and are configured to supply power to as well as ventilate and cool the miniaturized computation and storage merged system in a parallel working mode; the two power supply input board cards are configured to guide input power supply to the two power supply fan boards through the respective corresponding power supply board card slots;

both the two power supply fan boards include a power supply adaptation circuit, which is configured to transform a voltage of the power supply input to the power supply fan board and to supply the transformed output power supply to each component of the miniaturized computation and storage merged system.

The miniaturized computation and storage merged system further includes:

a case provided with a first type of slots and a second type of slots, wherein the mid-back board is placed in a middle position of the case; the first processing board, the second processing board and two power supply fan boards are placed in a front half part of the case via the first type of slots; the one or more rear-inserted board cards are placed in a rear half part of the case via the second type of slots and are fixed on the mid-back board via one or more board card slots.

The above solution provided by the embodiment of the present disclosure has advantages as follows:

in the miniaturized computation and storage merged system, the first processing board and the second processing board not only can achieve data processing functions (such as data computation and storage functions), but also can execute other corresponding functions when connected to the rear-inserted board cards with different functions inserted into the mid-back board, thus the miniaturized computation and storage merged system has a very high expansibility and a very high popularity.

DETAILED DESCRIPTION OF THE EMBODIMENTS

For a better understanding of the technical problem, technical scheme and advantages of the present disclosure, the present disclosure is described below in further detail in conjunction with accompanying drawings and specific embodiments.

Figure 1:
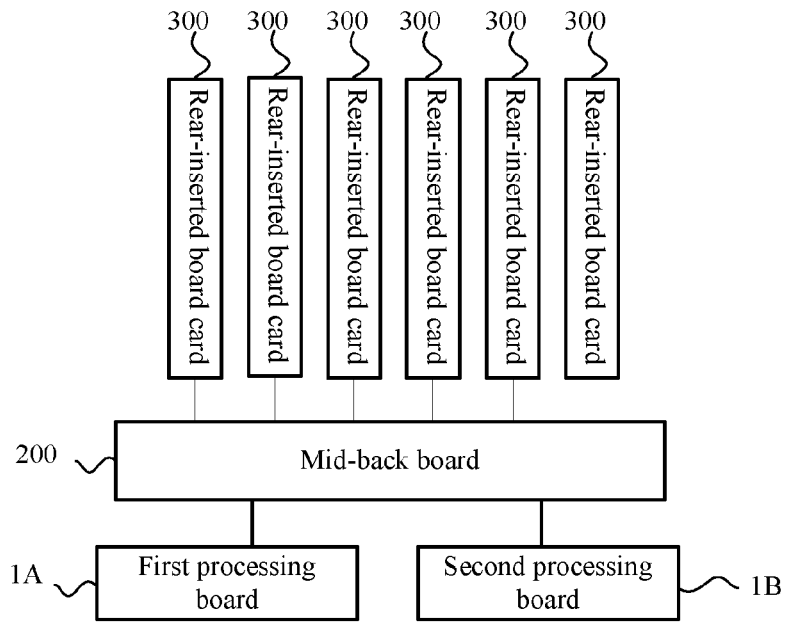
FIG. 1 is a structure diagram of a miniaturized computation and storage merged system according to an embodiment of the present disclosure.

As shown in FIG. 1, a miniaturized computation and storage merged system includes:

a mid-back board 200 having a plurality of board card slots;

a first processing board 1A which is connected with the mid-back board 200;

a second processing board 1B which is connected with the mid-back board 200; and one or more rear-inserted board cards 300, each of which is fixed on the mid-back board 200 via a board card slot and configured to provide support in data storage and/or computation for the first processing board 1A and the second processing board 1B, to enable the first processing board 1A and the second processing board 1B to complete a data storage and/or computation task.

In the miniaturized computation and storage merged system, the first processing board 1A and the second processing board 1B not only can achieve data processing functions (such as data computation and storage functions), but also can execute other corresponding functions when connected to rear-inserted board cards with different functions inserted into the mid-back board 200, thus the miniaturized computation and storage merged system has a very high expansibility and a very high popularity.

Figure 2:
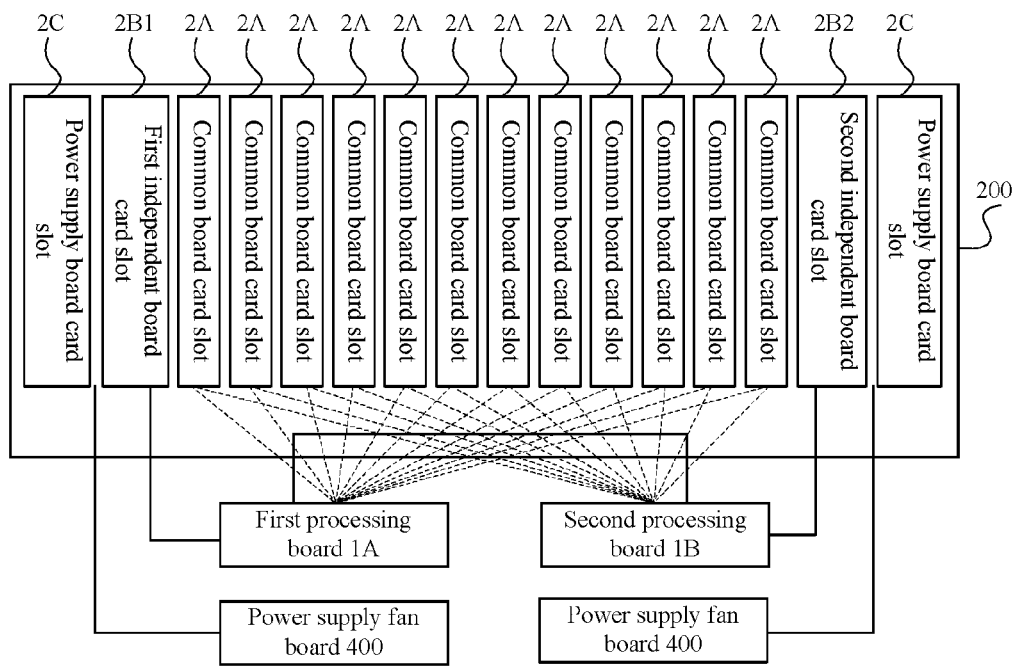
FIG. 2 is a diagram showing the connection between a mid-back board and a first processing board, a second processing board and a power supply fan board according to an embodiment of the present disclosure.

In an example embodiment, as shown in FIG. 2, in the above embodiment of the present disclosure, multiple common board card slots 2A are provided on the mid-back board 200.

Both the first processing board 1A (FIG. 1) and the second processing board 1B (FIG. 1) are connected with the multiple common board card slots 2A through SAS buses. The one or more rear-inserted board cards 300 (FIG. 1) include one or more SAS hard disk board cards, each of which is fixed on the mid-back board via a common board card slot 2A and is respectively connected with the first processing board 1A (FIG. 1) and the second processing board 1B (FIG. 1) through the SAS buses, to store the data of the processing boards.

In the miniaturized computation and storage merged system of the above embodiment, multiple SAS hard disk board cards may be inserted into the common board card slots 2A. The multiple SAS hard disk board cards may form a Redundant Array Of Independent Disk (RAID) disk array meeting SBB 2.1 standards together with the first processing board 1A (FIG. 1) and the second processing board 1B (FIG. 1), to act as a storage application for common network data.

In addition, in the above embodiment of the present disclosure, as shown in FIG. 2, the first processing board 1A (FIG. 1) and the second processing board 1B (FIG. 1) are connected with the multiple common board card slots 2A through PCIe buses; each of the one or more rear-inserted board cards 300 (FIG. 1) is fixed on the mid-back board 200 (FIG. 1) via a common board card slot 2A, and is respectively connected with the first processing board 1A (FIG. 1) and the second processing board 1B (FIG. 1) through the PCIe buses.

In the above embodiment, the first processing board 1A (FIG. 1) and the second processing board 1B (FIG. 1) specifically build an interaction with the one or more rear-inserted board cards 300 (FIG. 1) based on a PCIe bus protocol, to execute computing applications corresponding to the one or more rear-inserted board cards 300.

The first processing board 1A (FIG. 1) is connected with the second processing board 1B (FIG. 1) through a heartbeat line, the first processing board 1A (FIG. 1) is able to take over, when detecting through the heartbeat line that the second processing board 1B (FIG. 1) has a fault, each rear-inserted board card which is fixed on the common board card slot and originally controlled by the second processing board 1B (FIG. 1), or the second processing board 1B (FIG. 1) is able to take over, when detecting through the heartbeat line that the first processing board 1A (FIG. 1) has a fault, each rear-inserted board card which is fixed on the common board card slot and originally controlled by the first processing board 1A (FIG. 1).

In the above embodiment, the first processing board 1A and the second processing board 1B can improve the system's processing capability and reliability by employing a double-active working mode, and can also prevent the interruption of the system by employing an active-standby working mode.

In an example embodiment, in the above embodiment of the present disclosure, the one or more rear-inserted board cards further include one or more interface board cards, each of which is fixed on the mid-back board 200 via a common board card slot 2A and acts as an external multi-functional interface for the first processing board 1A and the second processing board 1B, the multi-functional interface including: TDM interface, IP interface, data collection and conversion interface.

It should be noted that, as foregoing described, the interface board card is inserted into the common board card slot 2A, therefore, the interface board card can be managed by both the first processing board 1A and the second processing board 1B based on the PCIe bus protocol.

In addition, in the above embodiment of the present disclosure, the one or more rear-inserted board cards further include one or more function board cards, each of which is fixed on the mid-back board 200 via a common board card slot 2A and is configured to provide a co-processing function for the first processing board 1A and the second processing board 1B, the co-processing function including: DPI, DSP and IPSec.

It should be noted that, as foregoing described, the function board card also is inserted into the common board card slot 2A, and therefore, the function board card can be managed by both the first processing board 1A and the second processing board 1B too.

In addition, as shown in FIG. 2, in the above embodiment of the present disclosure, a first independent board card slot 2B1 and a second independent board card slot 2B2 are provided on the mid-back board 200; the first processing board 1A is connected with the first independent board card slot 2B1 and the second processing board 1B is connected with the second independent board card slot 2B2; the one or more rear-inserted board cards further include: a first independent board card fixed on the mid-back board 200 via the first independent board card slot 2B1 and configured to provide an external interface or concatenation for the first processing board 1A; a second independent board card fixed on the mid-back board 200 via the second independent board card slot 2B2 and configured to provide an external interface or concatenation for the second processing board 1B.

In the above embodiment, the miniaturized computation and storage merged system also configures one private independent board card for each processing board (that is to say, the first independent board card is controlled by the first processing board 1A only), to facilitate a more specialized function.

In addition, as shown in FIG. 2, in the above embodiment of the present disclosure, two power supply board card slots 2C are provided on the mid-back board 200; the one or more rear-inserted board cards 300 further include: two power supply input board cards fixed on the mid-back board 300 via the two power supply board card slots 2C;

the miniaturized computation and storage merged system further includes: two power supply fan boards 400, which are connected with the two power supply board card slots 2C respectively, and are configured to supply power to as well as ventilate and cool the miniaturized computation and storage merged system in a parallel working mode;

the two power supply input board cards are configured to guide input power supply to the two power supply fan boards 400 through the respective corresponding power supply board card slots 2C.

Both the two power supply fan boards 400 include a power supply adaptation circuit, which is configured to transform a voltage of the power supply input to the power supply fan board 400 and to supply the transformed output power supply to each component of the miniaturized computation and storage merged system.

In the miniaturized computation and storage merged system, since the two power supply fan boards 400 employ a parallel working mode to share load, when one power supply fan board 400 has a fault, the other normal power supply fan board 400 still can provide a reliable cooling function and a reliable input power supply for the miniaturized computation and storage merged system.

Figure 3:
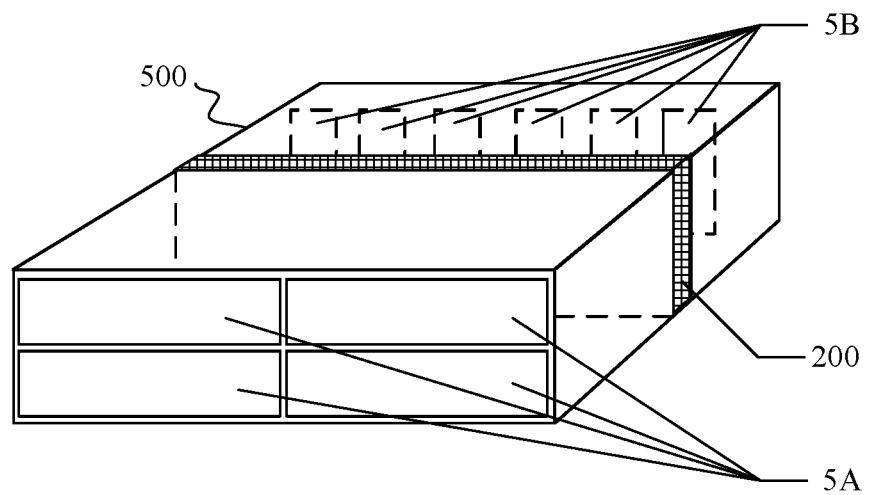
FIG. 3 is a stereo diagram of a case of a miniaturized computation and storage merged system according to an embodiment of the present disclosure.

In addition, as shown in FIG. 3, in the above embodiment of the present disclosure, the miniaturized computation and storage merged system further includes a case 500 provided with a first type of slots 5A and a second type of slots 5B, wherein the mid-back board 200 is placed in a middle position of the case 500; the first processing board 1A (FIG. 1), the second processing board 1B (FIG. 1) and the two power supply fan boards 400 (FIG. 2) are placed in a front half part of the case 500 via the first type of slots 5A; the one or more rear-inserted board cards 300 are placed in a rear half part of the case 500 via the second type of slots 5B and are fixed on the mid-back board 200 via one or more board card slots.

The structure of the miniaturized computation and storage merged system is described below in further detail with a specific embodiment in conjunction with FIG. 4 to FIG. 5.

Figure 4:
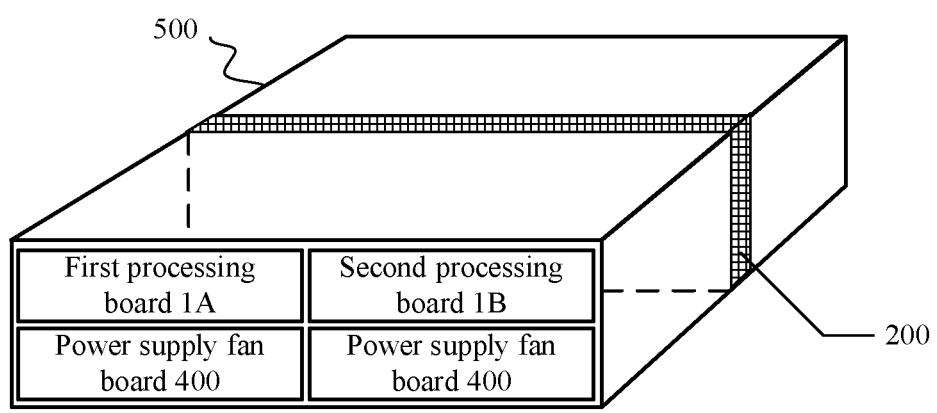
FIG. 4 is a front view of a case of a miniaturized computation and storage merged system according to an embodiment of the present disclosure.

As shown in FIG. 4, the miniaturized computation and storage merged system is provided with a case 500 with a 482.6 mm width and a 88.9 mm height, of which the front part is provided with 4 first type of slots into which the first processing board 1A, the second processing board 1B and 2 power supply fan boards 400 are inserted respectively, wherein the power supply fan board 400s are located below the first processing board 1A and the second processing board 1B. The mid-back board 200 is placed in a middle position of the case 500.

As shown in FIG. 2, the mid-back board 200 is provided with 16 board card slots arranged in sequence, including 2 power supply board card slots 2C, 1 first independent board card slot 2B1, 1 second independent board card slot 2B2 and 12 common board card slots 2A.

Figure 5:
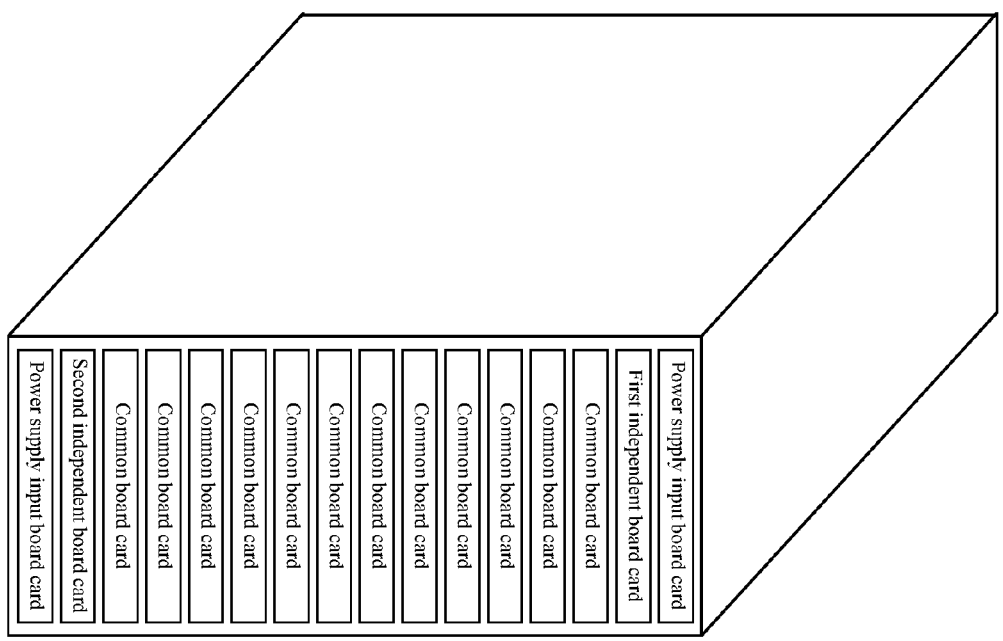
FIG. 5 is a rear view of a case of a miniaturized computation and storage merged system according to an embodiment of the present disclosure.

As shown in FIG. 5, 16 second type of slots are provided on the case 500 in correspondence with the mid-back board. 16 rear-inserted board cards are placed into the case 500 via the second type of slots and are inserted into the corresponding board card slots. Specifically, 2 power supply input board cards are inserted into the power supply board card slots 2C correspondingly, the first independent board card is inserted into the first independent board card slot 2B1 correspondingly, the second independent board card is inserted into the second independent board card slot 2B2 correspondingly, the remaining board cards such as SAS hard disk board cards are inserted into the common board card slots 2A. It should be noted that the rear-inserted board cards 300 inserted into the common board card slots 2A may have other functions, for example, the interface board card acts as an external TDM interface, an IP interface or a data collection and conversion interface for the first processing board 1A and the second processing board 1B, the function board card provides DPI, IPSec, DSP and other co-processing functions for the first processing board 1A and the second processing board 1B, to be used as a computing application.

The first processing board 1A and the second processing board 1B are connected with the multiple common board card slots 2A through PCIe buses respectively, to control the interface board card and the function board card inserted into the common board card slots 2A to implement the computation function. In addition, the first processing board 1A and the second processing board 1B also may be connected with the multiple common board card slots 2A through an SAS signal bus, to establish a connection with the SAS hard disk board card to realize data storage.

In addition, for the entire system, the two processing boards also can implement a management function for the power supply fan boards 400 and the rear-inserted board cards other than the power supply input board card. The specific implementation method for the management function may be: the first processing board 1A and the second processing board 1B are connected with the power supply fan board 400 and the rear-inserted board cards other than the power supply input board card through an independent management bus respectively, to establish respective management channel.

In addition, as shown in FIG. 2, the first processing board 1A and the second processing board 1B are connected with each other through a heartbeat line, so that the first processing board 1A and the second processing board 1B can detect the fault of one another. When one processing board has a fault, the other processing board can take over in real time the control of the rear-inserted board cards 300 inserted into the common board card slot 2A.

To sum up, the miniaturized computation and storage merged system in the present disclosure has a high integration level and a high expansibility. The SAS hard disk board card, the interface board card, the function board card together with the first processing board 1A (FIG. 1) and the second processing board 1B (FIG. 1) form a data computation and data storage merged system, which is particularly applicable to miniaturized applications in the field of communication and information.

The above is the example implementation of the present disclosure. It should be noted that, for the ordinary personnel in the technical field, many changes and modifications can be made to the present disclosure without departing from the principle of the present disclosure; these changes and modifications shall fall into the scope of protection defined by the claims of the present disclosure.

INDUSTRIAL APPLICABILITY

The technical solution provided in the embodiments of the present disclosure can be applied to the fields of communication, information and industrial control. In the miniaturized computation and storage merged system, the first processing board and the second processing board not only can achieve data processing functions (such as data computation and storage functions), but also can execute other corresponding functions when connected to the rear-inserted board cards with different functions inserted into the mid-back board, thus the miniaturized computation and storage merged system has a very high expansibility and a very high popularity.

What is claimed is:
1. A miniaturized computation and storage merged system, comprising:

a mid-back board having a plurality of board card slots, wherein two power supply board card slots are provided on the mid-back board;
a first processing board which is connected with the mid-back board;
a second processing board which is connected with the mid-back board; and
one or more rear-inserted board cards, each of which is fixed on the mid-back board via a board card slot, wherein the one or more rear-inserted board cards are configured to provide support in data storage and/or computation for the first processing board and the second processing board, to enable the first processing board and the second processing board to complete a data storage and/or computation task, wherein the one or more rear-inserted board cards further comprise: two power supply input board cards fixed on the mid-back board via the two power supply board card slots;
two power supply fan boards, which are connected with the two power supply board card slots respectively, and are configured to supply power to as well as ventilate and cool the miniaturized computation and storage merged system in a parallel working mode;
the first processing board and the second processing board are connected with the power supply fan boards and the rear-inserted board cards other than the power supply input board card through an independent management bus respectively, to establish respective management channel.

2. The miniaturized computation and storage merged system as claimed in claim 1, wherein multiple common board card slots are provided on the mid-back board.

3. The miniaturized computation and storage merged system as claimed in claim 2, wherein both the first processing board and the second processing board are connected with the multiple common board card slots through Serial Attached Small Computer System Interface (SAS) buses; the one or more rear-inserted board cards comprise one or more SAS hard disk board cards, each of which is fixed on the mid-back board via a common board card slot and is respectively connected with the first processing board and the second processing board through the SAS buses.

4. The miniaturized computation and storage merged system as claimed in claim 2, wherein both the first processing board and the second processing board are connected with the multiple common board card slots through Peripheral Component Interface Express (PCIe) buses; each of the one or more rear-inserted board cards is fixed on the mid-back board via a common board card slot, and is respectively connected with the first processing board and the second processing board through the PCIe buses.

5. The miniaturized computation and storage merged system as claimed in claim 1, wherein the first processing board is connected with the second processing board through a heartbeat line, the first processing board is able to take over, when detecting through the heartbeat line that the second processing board has a fault, each rear-inserted board card which is fixed on a common board card slot and originally controlled by the second processing board, or the second processing board is able to take over, when detecting through the heartbeat line that the first processing board has a fault, each rear-inserted board card which is fixed on a common board card slot and originally controlled by the first processing board.

6. The miniaturized computation and storage merged system as claimed in claim 4, wherein the one or more rear-inserted board cards further comprise one or more interface board cards, each of which is fixed on the mid-back board via a common board card slot and acts as an external multi-functional interface for the first processing board and the second processing board, the multi-functional interface comprising: Time Division Multiplexing (TDM) interface, Internet Protocol (IP) interface, data collection and conversion interface.

7. The miniaturized computation and storage merged system as claimed in claim 4, wherein the one or more rear-inserted board cards further comprise one or more function board cards, each of which is fixed on the mid-back board via a common board card slot and is configured to provide a co-processing function for the first processing board and the second processing board, the co-processing function comprising: Deep Packet Inspection (DPI), Digital Signal Processing (DSP), and Internet Protocol Security (IPSec).

8. The miniaturized computation and storage merged system as claimed in claim 1, wherein a first independent board card slot and a second independent board card slot are provided on the mid-back board, wherein the first processing board is connected with the first independent board card slot and the second processing board is connected with the second independent board card slot; the one or more rear-inserted board cards further comprise: a first independent board card fixed on the mid-back board via the first independent board card slot and configured to provide an external interface or concatenation for the first processing board; a second independent board card fixed on the mid-back board via the second independent board card slot and configured to provide an external interface or concatenation for the second processing board.

9. The miniaturized computation and storage merged system as claimed in claim 1, wherein the two power supply input board cards are configured to guide input power supply to the two power supply fan boards through respective corresponding power supply board card slots;
both the two power supply fan boards comprise a power supply adaptation circuit, which is configured to transform a voltage of the power supply input to the power supply fan board and to supply the transformed output power supply to each component of the miniaturized computation and storage merged system.

10. The miniaturized computation and storage merged system as claimed in claim 9, further comprising:
a case provided with a first type of slots and a second type of slots, wherein the mid-back board is placed in a middle position of the case; the first processing board, the second processing board and the two power supply fan boards are placed in a front half part of the case via the first type of slots; the one or more rear-inserted board cards are placed in a rear half part of the case via the second type of slots and are fixed on the mid-back board via one or more board card slots.

* * * * *